(12) United States Patent
Kim et al.

(10) Patent No.: US 7,214,604 B2
(45) Date of Patent: May 8, 2007

(54) METHOD OF FABRICATING ULTRA THIN FLIP-CHIP PACKAGE

(75) Inventors: Soon-Bum Kim, Gyeonggi-do (KR); Se-Young Jeong, Seoul (KR); Se-Yong Oh, Gyeonggi-do (KR); Nam-Seog Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 275 days.

(21) Appl. No.: 10/973,528

(22) Filed: Oct. 25, 2004

(65) Prior Publication Data

US 2005/0090090 A1    Apr. 28, 2005

(30) Foreign Application Priority Data

Oct. 24, 2003    (KR) ............. 10-2003-0074660

(51) Int. Cl.
    *H01L 21/44* (2006.01)
(52) U.S. Cl. ............. 438/613; 438/614; 257/E21.509
(58) Field of Classification Search ............. 438/613, 438/614
    See application file for complete search history.

(56) References Cited

U.S. PATENT DOCUMENTS

| | | | | |
|---|---|---|---|---|
| 5,118,299 A | * | 6/1992 | Burns et al. ............. | 439/74 |
| 5,172,473 A | * | 12/1992 | Burns et al. ............. | 29/885 |
| 5,185,073 A | * | 2/1993 | Bindra et al. ............. | 205/104 |
| 5,435,057 A | * | 7/1995 | Bindra et al. ............. | 29/830 |
| 5,541,135 A | * | 7/1996 | Pfeifer et al. ............. | 438/108 |
| 5,939,786 A | * | 8/1999 | Downes et al. ............. | 257/739 |
| 6,043,150 A | * | 3/2000 | Downes et al. ............. | 438/666 |
| 6,291,879 B1 | * | 9/2001 | Yamano ............. | 257/691 |
| 6,384,343 B1 | * | 5/2002 | Furusawa ............. | 174/260 |
| 6,841,872 B1 | * | 1/2005 | Ha et al. ............. | 257/736 |
| 6,959,856 B2 | * | 11/2005 | Oh et al. ............. | 228/245 |
| 2002/0121692 A1 | * | 9/2002 | Lee et al. ............. | 257/737 |
| 2005/0208751 A1 | * | 9/2005 | Oh et al. ............. | 438/614 |

FOREIGN PATENT DOCUMENTS

| KR | 1996-039234 | 11/1996 |
|---|---|---|
| KR | P2002-79136 | 10/2002 |

OTHER PUBLICATIONS

English language abstract of Korean Publication No. P2002-79136.
English language abstract of Korean Publication No. 1996-039234.

\* cited by examiner

*Primary Examiner*—David A. Zarneke
(74) *Attorney, Agent, or Firm*—Marger Johnson & McCollom, P.C.

(57) ABSTRACT

Provided is a method of fabricating an ultra thin flip-chip package. In the above method, an under barrier metal film is formed on a bond pad of a semiconductor chip. Three-dimensional structured solder bumps are formed on the under barrier metal film, each of the solder bumps including a bar portion and a ball portion disposed at an end of the bar portion. The semiconductor chip including the three-dimensional structured solder bumps is bonded to a solder layer on a printed circuit board to complete a flip-chip package. According to the present invention, by employing the three-dimensional structured solder bumps, it is possible to lower the height of the solder bumps, thereby improving the reliability of an ultra thin flip-chip package.

14 Claims, 8 Drawing Sheets

METHOD OF FABRICATING ULTRA THIN FLIP-CHIP PACKAGE

BACKGROUND OF THE INVENTION

This application claims priority from Korean Patent Application No. 2003-74660, filed on Oct. 24, 2003, the disclosure of which is incorporated herein by reference in its entirety.

1. Field of the Invention

This disclosure relates to a method of fabricating a semiconductor package, and more particularly, to a method of fabricating an ultra thin flip-chip package.

2. Description of the Related Art

To mount a semiconductor chip on a printed circuit board (PCB), flip-chip packaging can be used. Flip-chip packaging is a method of directly bonding a bond pad of a semiconductor chip to a PCB, and has advantages of occupying a small area and a fast operating speed.

FIGS. 1 through 8 are sectional views illustrating a conventional method of fabricating a flip-chip package.

Referring to FIG. 1, a semiconductor chip 17 including a bond pad 13 formed on a semiconductor substrate 11 and a passivation film pattern 15 partially exposing the bond pad 13 is prepared. A polyimide film pattern 19 exposing an upper surface of the bond pad 13 is formed on the passivation film pattern 15. The polyimide film pattern 19 protects the surface of the semiconductor chip 17.

A first under barrier metal film 21 is formed on the semiconductor chip 17 and the polyimide film pattern 19. Accordingly, a portion of the first under barrier metal film 21 is formed on the bond pad 13. The first under barrier metal film 21 is a composite film including a titanium film and a nickel film stacked sequentially.

Referring to FIG. 2, by forming a photoresist film on the first under barrier metal film 21 and patterning the photoresist film, a photoresist pattern 23 having a hole 22 exposing a region above the bond pad 13 is formed. The first under barrier metal film 21 on the bond pad 13 is exposed by the photoresist pattern 23.

Next, referring to FIG. 3, a second under barrier metal film 25 is then formed on the exposed portion of the first under barrier metal film 21. The second under barrier metal film 25 is formed by an electroplating method in which the photoresist pattern 23 is used as an electroplating-preventing film. The second under barrier metal film 25 is a nickel film.

Referring to FIG. 4, a solder bump 27 is formed on the second under barrier metal film 25 so as to fill the hole 22 of the photoresist pattern 23. The solder bump 27 is formed by an electroplating method in which the photoresist pattern 23 is used as a film for preventing an electroplating. The solder bump 27 is formed of an alloy film composed of lead and tin.

Referring to FIG. 5, the photoresist pattern 23 is removed. Then, referring to FIG. 6, the first under barrier metal film 21 is etched by using the solder bump as an etch mask. Accordingly, the first under barrier metal film 21 is disposed only below the second under barrier metal film 25.

Referring to FIGS. 7 and 8, a water-soluble flux 29 is coated on the resultant structure to cover the solder bump 27. Thereafter, the solder bump 27 is reflowed by a thermal process using the water-soluble flux 29, and is made in a rounded form. Then, although not shown in the drawings, the semiconductor chip 17 on which the solder bump 27 is formed is directly bonded to a PCB (not shown), thereby completing the fabrication of the flip-chip package.

The method of fabricating the flip-chip package in FIGS. 1 through 8 has the following drawbacks.

First, in the conventional method, the height of the solder bump 27 should be limited to a height of 100 μm so as to permit the packaging of the semiconductor chip. Due to this limitation, it is difficult to realize an ultra thin flip-chip package. Also, when the solder bump is made to the height of 100 μm, the height of the photoresist pattern used as the electroplating-preventing film should be at least 70 μm, which results in an increase in the fabrication costs.

Secondly, in the conventional method, since the increase in the integrity of a semiconductor chip requires the size of the bond pad and the height of the solder bump to be decreased, the structural reliability of the flip-chip package is lowered.

Thirdly, in the conventional method, since a joint crack generated in the solder layer is propagated after the bonding of the solder bump and the PCB, the structural reliability of the flip-chip package is lowered.

Fourthly, since the conventional method requires the complicated processes as illustrated in FIGS. 1 through 8, especially the reflow process of the solder bump, the flip-chip package is subject to thermal stress.

SUMMARY OF THE INVENTION

Embodiments of the invention provide methods of fabricating an ultra thin flip-chip package, capable of reducing fabrication costs and enhancing the structural reliability by using a simplified process.

In one embodiment, a semiconductor package comprises a semiconductor chip including a bond pad formed on a semiconductor substrate and a passivation film pattern overlying the semiconductor substrate and exposing the bond pad. A first under barrier metal film is formed on the bond pad. A plurality of solder bumps are formed overlying the first under barrier metal film. The solder bumps each include a bar portion and a ball portion formed at an end of the bar portion. The package further includes a package substrate such as a printed circuit board. The ball portions of the solder bumps are contacted with the package substrate to form a semiconductor package.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE PREFERRED EMBODIMENTS

Figure 1:
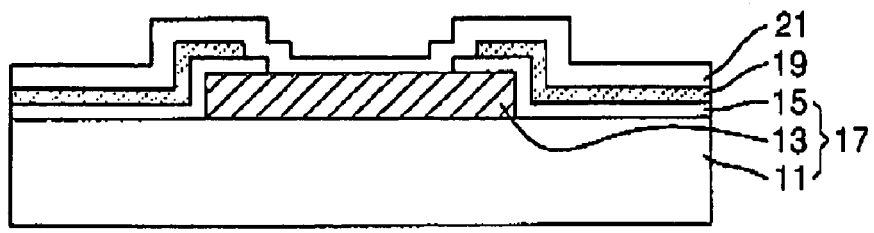
FIGS. 1 through 8 are sectional views illustrating a conventional method of fabricating a flip-chip package.
Figure 2:
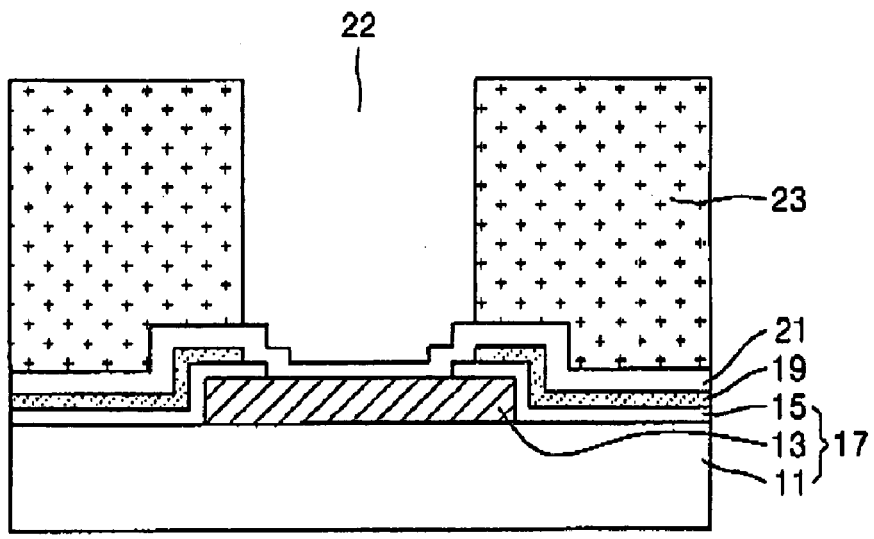
Figure 3:
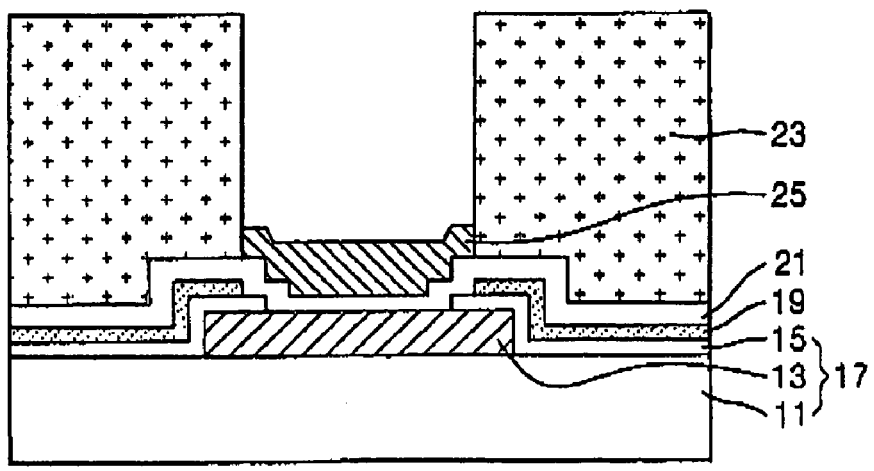
Figure 4:
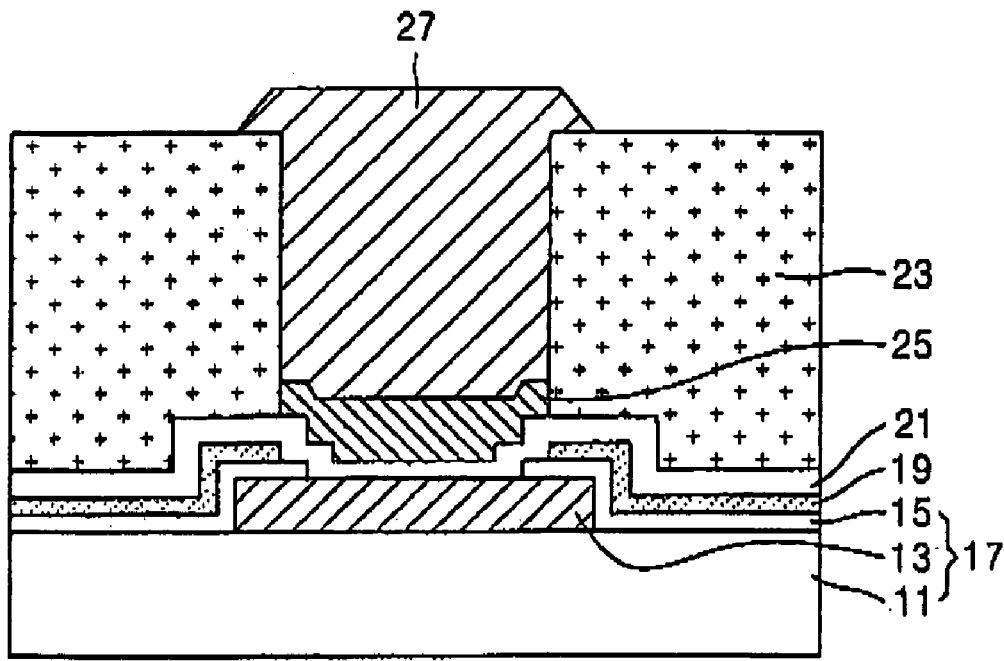
Figure 5:
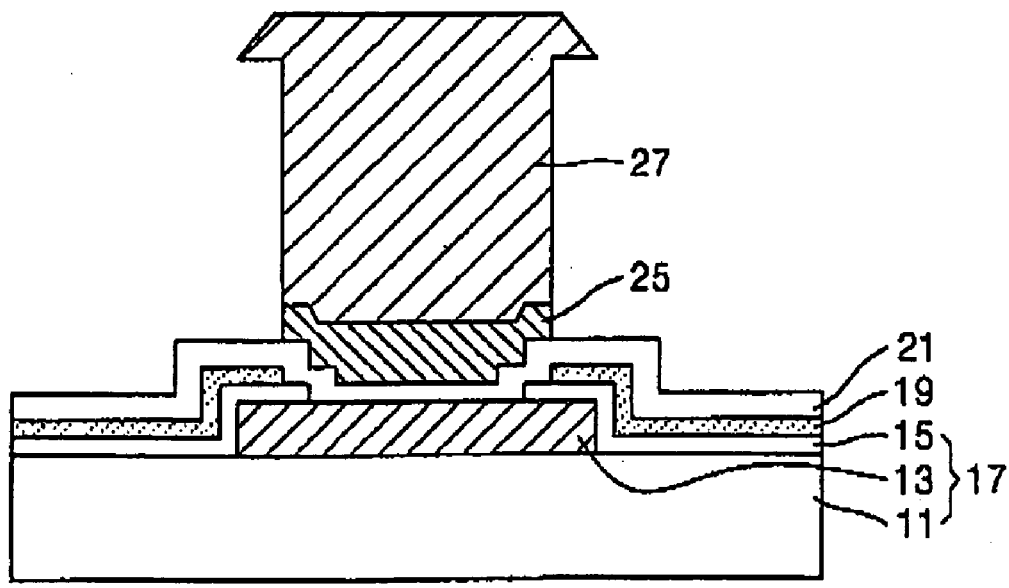
Figure 6:
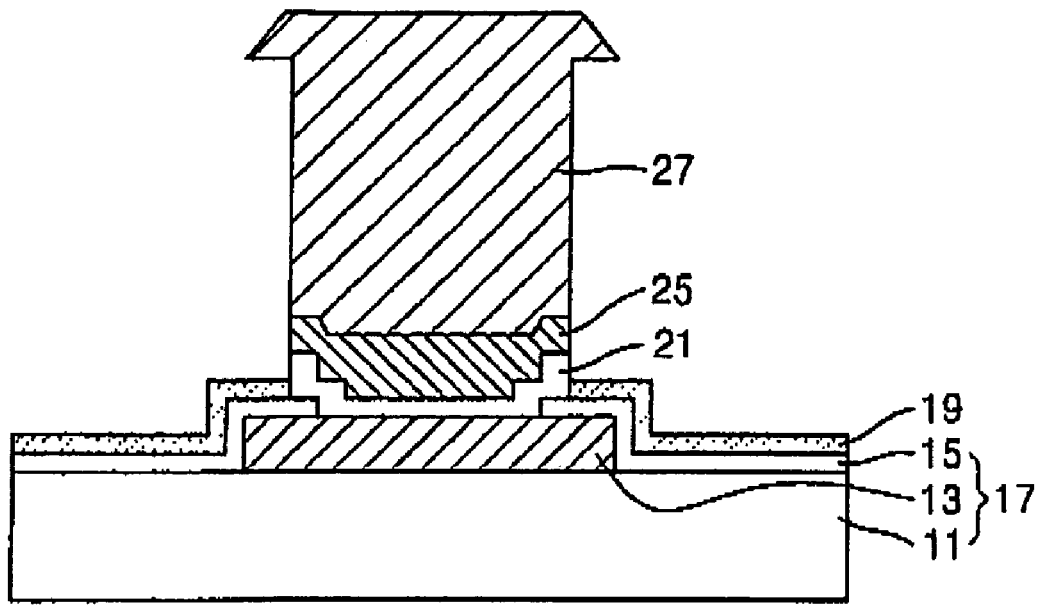
Figure 7:
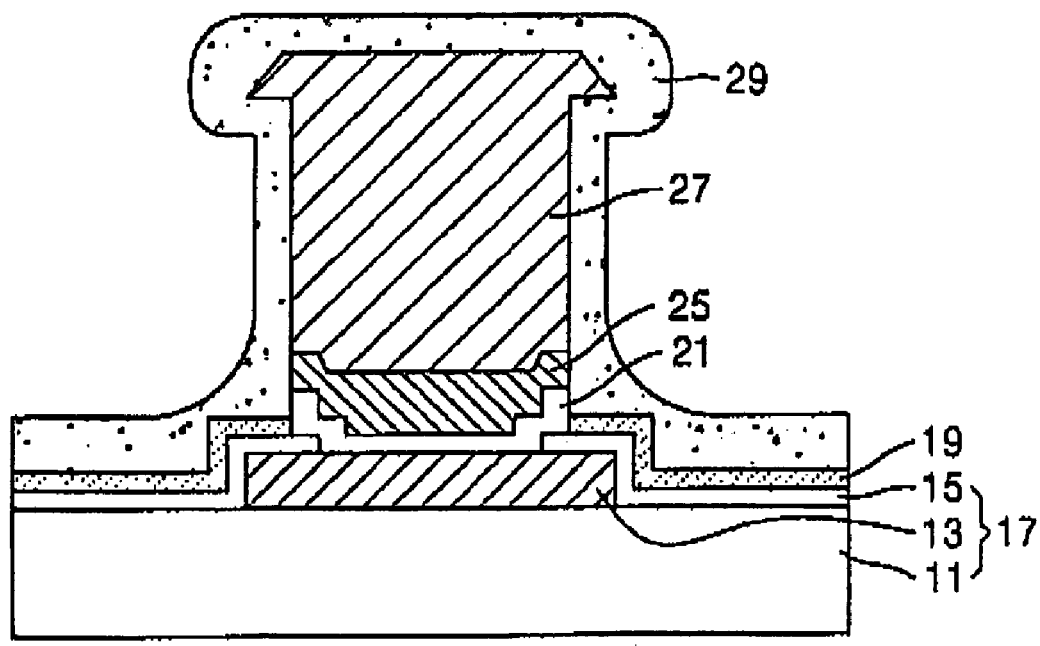
Figure 8:
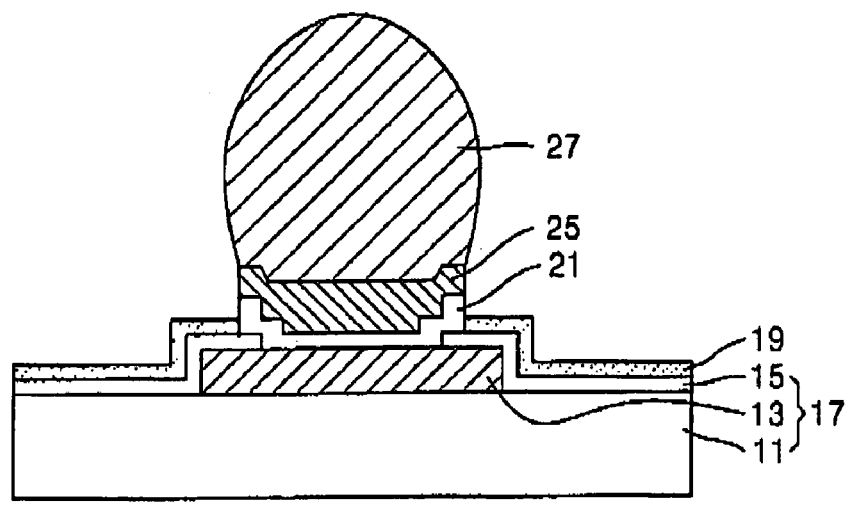

Embodiments of the invention will now be described more fully with reference to the accompanying drawings. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity.

Figure 16:
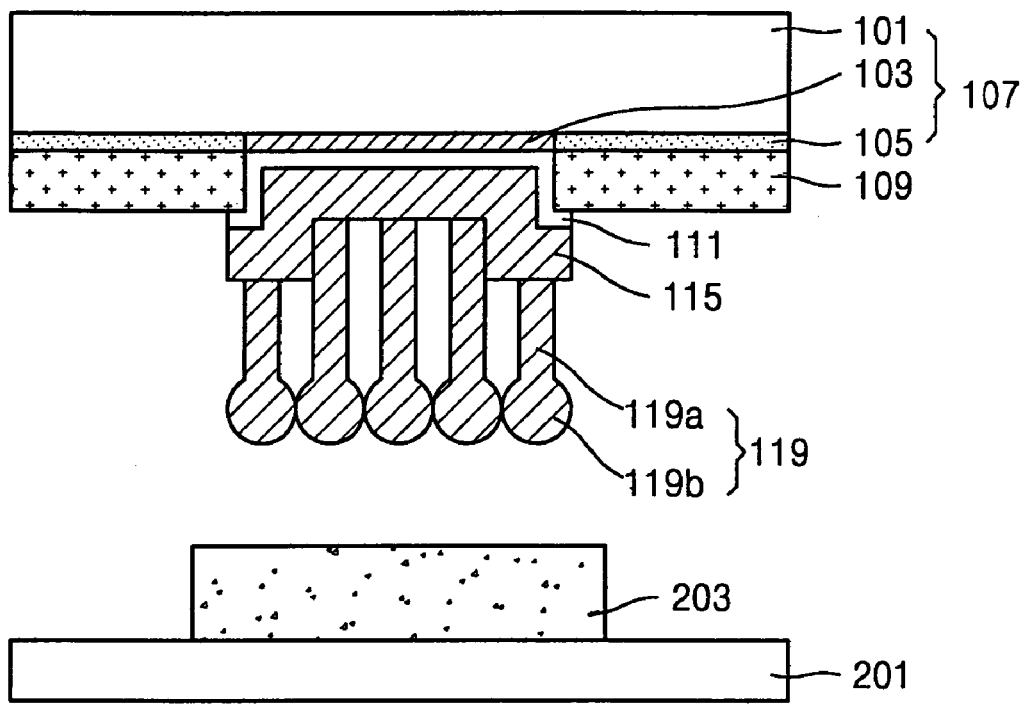
Figure 17:
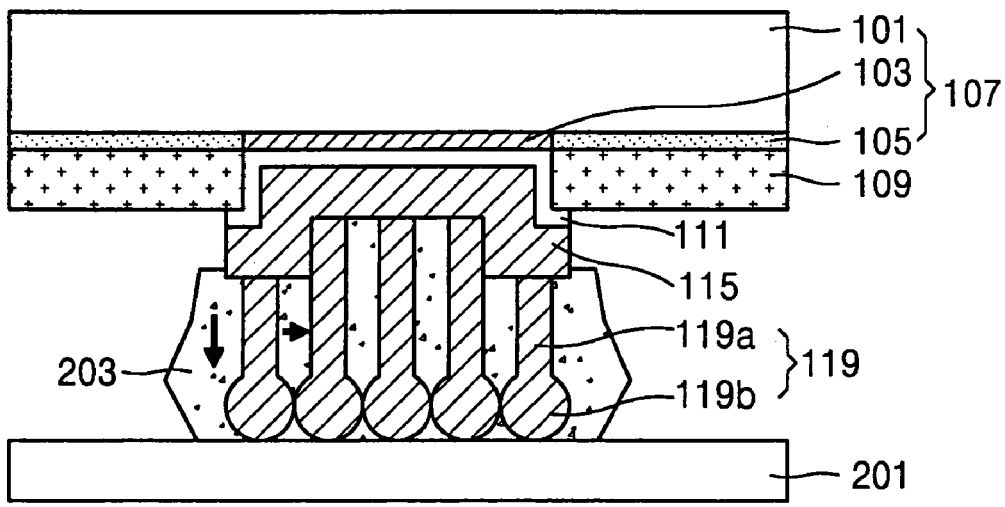
Figure 18:
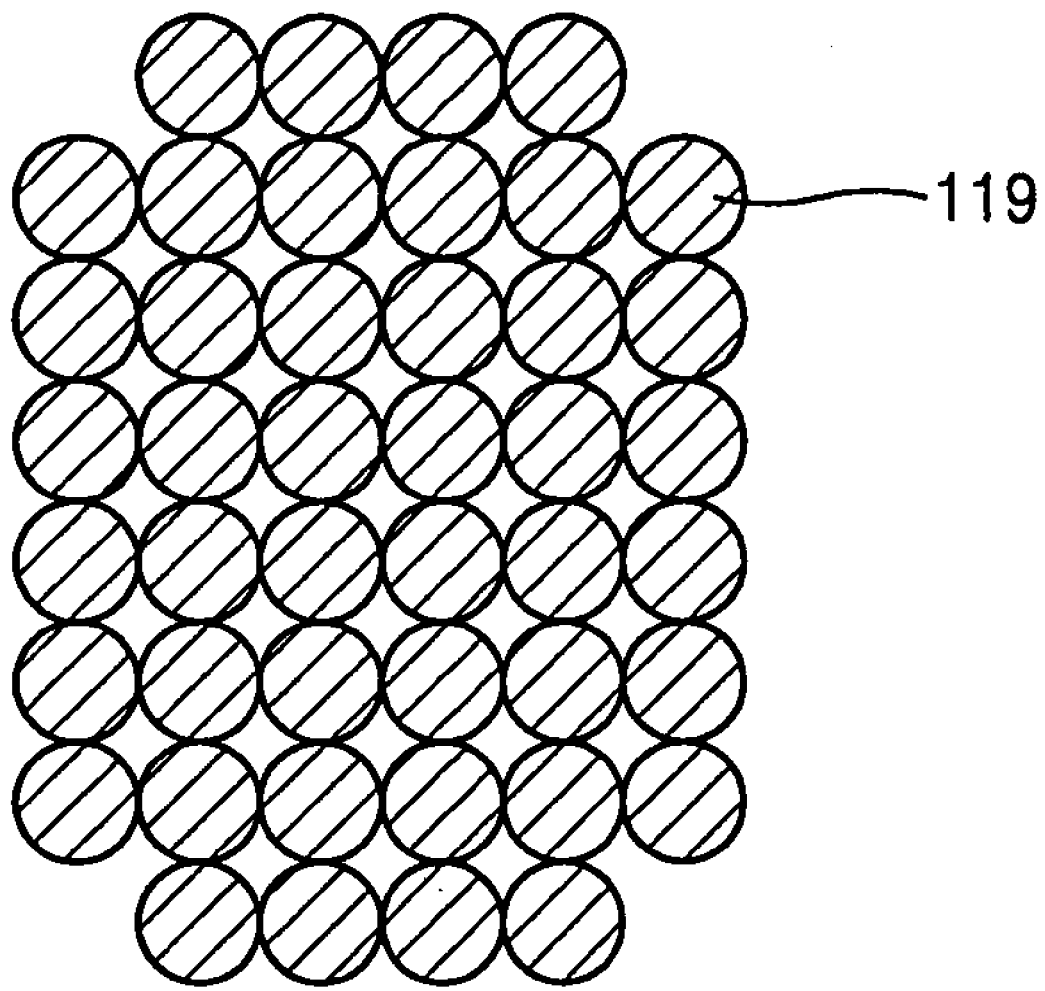
FIG. 18 is a plan view of solder bumps made when the ultra thin flip-chip is fabricated according to an embodiment of the invention.

FIGS. 9 through 17 are sectional view illustrating a method of fabricating an ultra thin flip-chip package according to an embodiment of the invention, and FIG. 18 is a plan view of solder bumps made when the ultra thin flip-chip is fabricated according to an embodiment of the invention.

Figure 9:
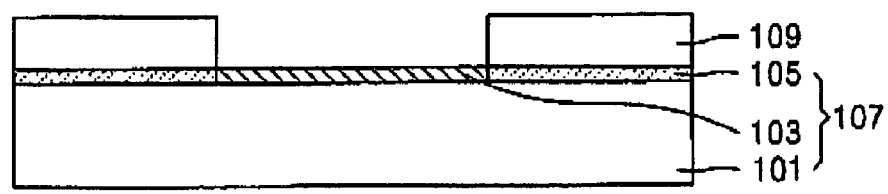
FIGS. 9 through 17 are sectional views illustrating a method of fabricating an ultra thin flip-chip package according to an embodiment of the invention.

Referring to FIG. 9, a semiconductor chip 107 including a bond pad 103 and a passivation film pattern 105 exposing the bond pad 103 formed on a semiconductor substrate 101 is prepared. The bond pad 103 corresponds to an electrical connection passage of the semiconductor chip 107 to which an external electrical signal is applied. The bond pad 103 may be formed of an aluminum (Al) film or a copper (Cu) film. The passivation film pattern 105 is a material film protecting the semiconductor substrate 101 from contaminant particles or physical stress, and may be formed of a silicon nitride film.

On the passivation film pattern 105, a buffer film pattern 109 is formed. The buffer film pattern 109 is a material film that can reduces physical stress applied to the semiconductor chip 107 during the bonding of the semiconductor chip 107 to a printed circuit board (PCB). The buffer film pattern may be formed of a polyimide film.

Figure 10:
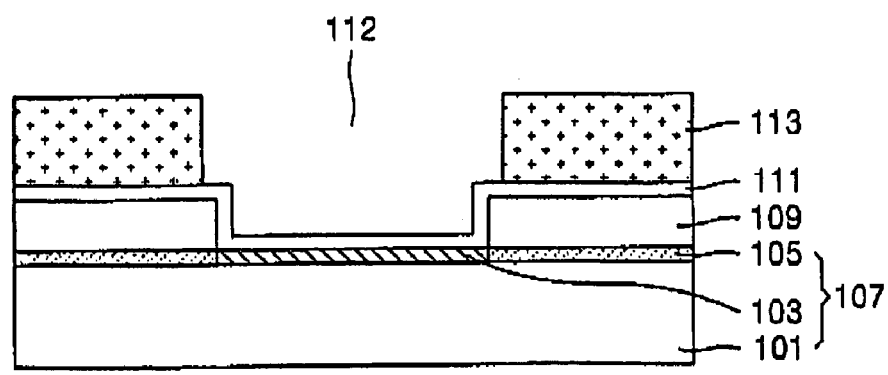

Referring to FIG. 10, a first under barrier metal (UBM) film 111 is formed on the buffer film pattern 109 and the bond pad 103. The first under barrier metal film 111 increases an electrical conductive area of the bond pad 103. The first under barrier metal film 111 may be formed by a sputtering method, and may be a composite film including a titanium film and a nickel film, which are stacked sequentially.

Next, a photoresist film is coated on the first under barrier metal film 111 and is patterned to form a first photoresist pattern 113 having a hole 112 exposing a region of the first under barrier metal film 111 on the bond pad 103.

Figure 11:
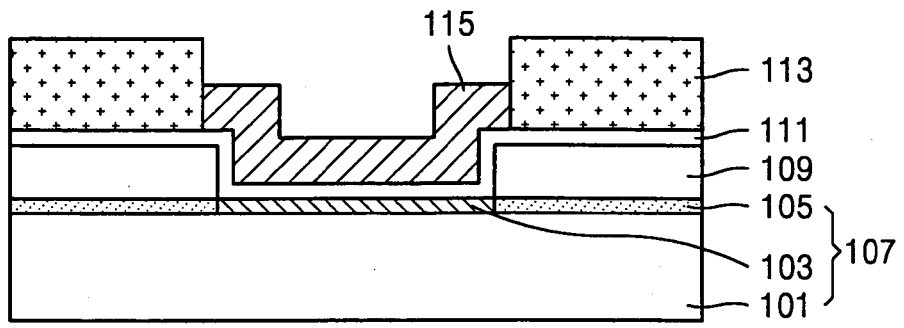

Referring to FIG. 11, a second under barrier metal (UBM) film 115 is formed on the exposed region of the first under barrier metal film 111. In other words, the second under barrier metal film 115 is formed on the first under barrier metal film 111 inside the hole 112. The second under barrier metal film 115 prevents the first under barrier metal film 111 from being diffused. The second under barrier metal film 115 may be formed by an electroplating method in which the photoresist pattern 113 is used as a film for preventing electroplating. The second under barrier metal film 115 may be formed of a gold (AU) film.

Figure 12:
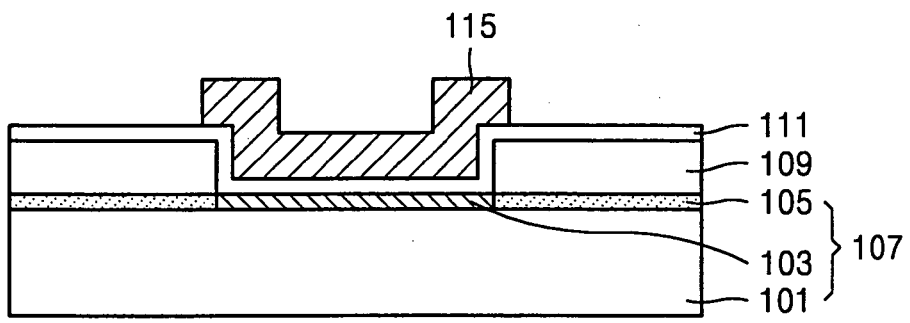

Next, referring to FIG. 12, the photoresist pattern 113 is removed.

Figure 13:
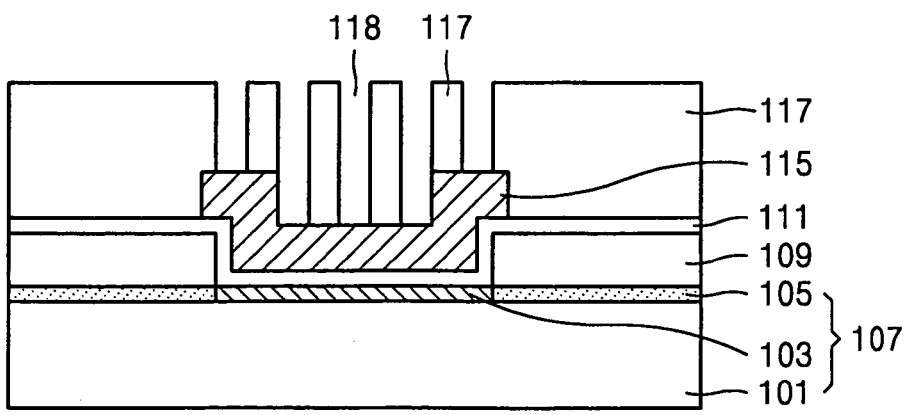

Referring to FIG. 13, a second photoresist pattern 117 is formed on the second under barrier metal film 115 and the first under baffler metal film 111. The second photoresist pattern 117 formed on the second under baffler metal includes a plurality of bars with a plurality of holes 118 formed between the bars.

Figure 14:
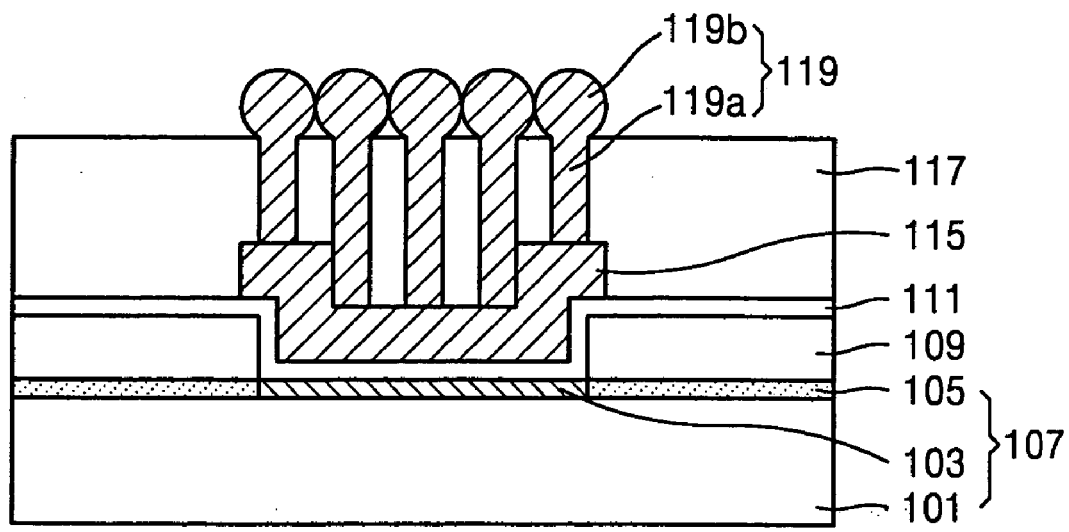

Referring to FIG. 14, a plurality of solder bumps 119 are formed on the second under barrier metal film 115 and fill the holes 118 through the second photoresist pattern 117. Each of the solder bumps 119 includes a bar portion 119*a* and a ball portion 119*b* formed at an upper portion of the solder bump 119. The ball portions 119*b* are bonded to each other to reduce the volume during a subsequent soldering process with a PCB. The solder bumps 119 may be formed by an electroplating method using the second photoresist pattern 117 as an electroplating-preventing film. The solder bumps 119 may be formed of an alloy film including lead and tin.

Figure 15:
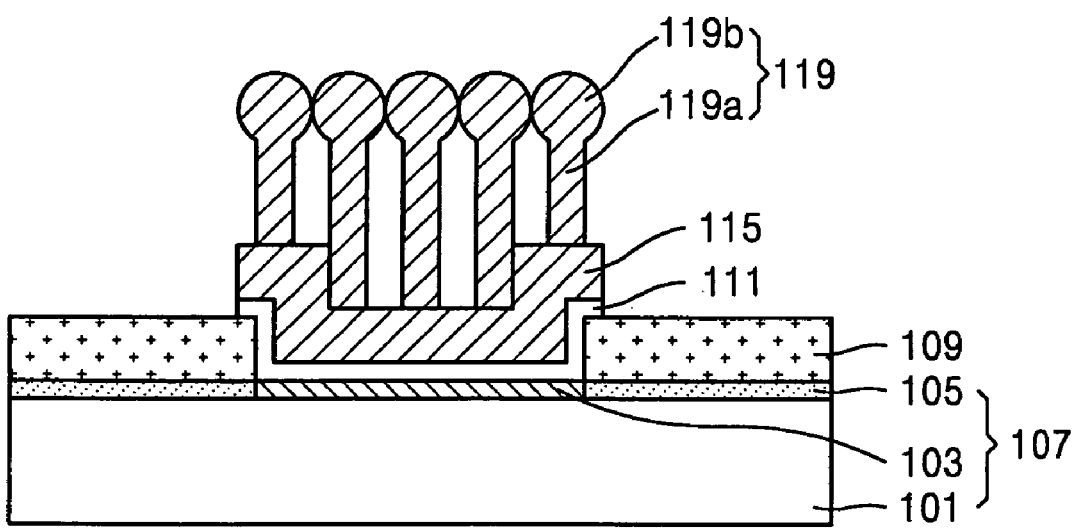

Referring to FIG. 15, the photoresist pattern 117 is removed. By doing so, formation of the three-dimensional structured solder bumps 119, including the bars 119*a* and the ball portions 119*b*, is completed.

Thus, although the three-dimensional structured solder bumps 119 are not as high as those of the prior art, a subsequent flip-chip bonding process can be easily performed, so that an ultra thin flip-chip package can be realized and the fabrication costs can be lowered.

The three-dimensional structured solder bumps are bonded to adjacent another solder bumps 119, particularly ball portions 119*b*, as shown in FIG. 18. Accordingly, the three-dimensional structured solder bumps 119 can secure a predetermined amount of solder volume, so that a super ultra thin flip-chip package can be realized.

Referring to FIG. 15, the first under barrier metal film 111 is etched using the second under barrier metal film 115 and the solder bumps 119 as an etch mask. Accordingly, the first under barrier metal film 111 is disposed only below the second under barrier metal film 115.

Referring to FIGS. 16 and 17, the semiconductor chip 107 including the solder bumps 119 may be bonded to a PCB 201 using a flux 203 by a soldering process, thereby completing a flip-chip package. The flip-chip package can prevent a joint crack generated in the solder layer after the soldering process from propagating in a horizontal direction (direction perpendicular to the lengths of the bar of the solder bumps 119), and can also prevent the joint crack from propagating in a vertical direction (direction parallel to the lengths of the bars 119*a* of the solder bumps 119) due to the bars 119*a* of the solder bumps 119.

As described above, the method of fabricating an ultra thin flip-chip package according to an embodiment of the invention enables the realization of an ultra thin flip-chip package having enhanced structural reliability by employing three-dimensional structured solder bumps to decrease the heights of the solder bumps.

Also, a joint crack can be prevented from being propagated in the horizontal and vertical directions inside the solder layer because each of the solder bumps includes a bar with a ball portion at on end.

Further, since a flip-chip package can be realized with a simplified process compared to the conventional processes, and can omit the reflow process of the solder bumps, a flip-chip package not having thermal stress can be obtained.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor package, the method comprising:
   preparing a semiconductor chip including a bond pad formed on a semiconductor substrate and a passivation film pattern overlying the semiconductor substrate and exposing the bond pad;
   forming a first under barrier metal film on the bond pad;
   forming a plurality of solder bumps overlying the first under barrier metal film, the solder bumps each including a bar portion and a ball portion formed at an end of the bar portion; and directly contacting the ball portion of the solder bumps with a package substrate to form a semiconductor package.

2. The method of claim 1, before forming a plurality of solder bumps, further comprising forming a second under barrier metal film on the first under barrier metal film overlying the bond pad.

3. The method of claim 2, wherein the second under barrier metal film is a nickel film.

4. The method of claim 2, wherein the forming the second under barrier metal film comprises:
   forming a first photoresist pattern on the first under barrier metal film, the first photoresist pattern having a hole extending therethrough, the hole overlying the bond pad;
   forming the second under barrier metal film within the hole and on the first under barrier metal film; and
   removing the first photoresist pattern.

5. The method of claim 4, wherein the second under barrier metal film is formed by an electroplating method using the first photoresist pattern as a film for preventing electroplating.

6. The method of claim 1, wherein forming the plurality of solder bumps comprises:
   forming a second photoresist pattern on the first under barrier metal film and the second under barrier metal film, the second photoresist pattern including a plurality of bars with holes interposed between the bars;
   forming the solder bumps by filling the holes of the second photoresist pattern; and
   removing the second photoresist pattern.

7. The method of claim 6, wherein the solder bumps are formed by an electroplating method in which the second photoresist pattern is used as a film for preventing electroplating.

8. The method of claim 1, wherein the solder bumps are formed of an alloy film including lead and tin.

9. The method of claim 1, wherein the first under barrier metal film is formed of a composite film including a titanium film and a nickel film stacked sequentially.

10. The method of claim 9, wherein the first under barrier metal film is formed by a sputtering method.

11. A method of fabricating an ultra thin flip-chip package, the method comprising:
   preparing a semiconductor chip including a bond pad formed on a semiconductor substrate and a passivation film pattern overlying the semiconductor substrate and exposing the bond pad;
   forming a buffer film pattern on the passivation film pattern;
   forming a first under barrier metal film on the bond pad and the buffer film pattern;
   forming a second under barrier metal film on the first under barrier metal film overlying the bond pad;
   forming a plurality of solder bumps on the second under barrier metal film, each of the solder bumps including a bar portion and a ball portion formed at an end of the bar portion;
   etching the first under barrier metal film on the buffer film pattern; and
   coupling the semiconductor chip to a printed circuit board using the solder bumps.

12. The method of claim 11, wherein the buffer film pattern is a polyimide film.

13. The method of claim 11, wherein the first under barrier metal film is formed of a composite film including a titanium film and a nickel film stacked sequentially.

14. The method of claim 13, wherein the first under barrier metal film is formed by a sputtering method.

* * * * *